(12) United States Patent
Ni et al.

(10) Patent No.: US 6,690,166 B2
(45) Date of Patent: Feb. 10, 2004

(54) NUCLEAR MAGNETIC RESONANCE TECHNOLOGY FOR NON-INVASIVE CHARACTERIZATION OF BONE POROSITY AND PORE SIZE DISTRIBUTIONS

(75) Inventors: Qingwen Ni, San Antonio, TX (US); Xiaodu Wang, San Antonio, TX (US); James D. King, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 154 days.

(21) Appl. No.: 09/964,018

(22) Filed: Sep. 26, 2001

(65) Prior Publication Data

US 2003/0057947 A1 Mar. 27, 2003

(51) Int. Cl.[7] ................................................. G01V 3/00
(52) U.S. Cl. ......................... 324/309; 324/307; 324/318
(58) Field of Search ................................ 324/309, 307, 324/303, 300; 342/115; 600/410; 128/653

(56) References Cited

U.S. PATENT DOCUMENTS

| | | | | |
|---|---|---|---|---|
| 4,579,121 A | * | 4/1986 | Macovski .................. 128/653 |
| 5,072,732 A | * | 12/1991 | Rapoport et al. ........ 128/653.2 |
| 5,247,934 A | | 9/1993 | Wehrli .................... 128/653.2 |
| 5,270,651 A | | 12/1993 | Wehrli ....................... 324/309 |
| 5,995,863 A | | 11/1999 | Farace et al. ............... 600/410 |
| 6,140,817 A | * | 10/2000 | Flaum et al. ............... 324/303 |
| 6,185,444 B1 | * | 2/2001 | Ackerman et al. .......... 600/410 |
| 6,225,803 B1 | * | 5/2001 | Chen .......................... 324/303 |
| 6,278,891 B1 | * | 8/2001 | Reiderman et al. ......... 600/410 |
| 6,285,901 B1 | * | 9/2001 | Taicher et al. .............. 600/410 |
| 6,400,310 B1 | * | 6/2002 | Byrens et al. .............. 342/115 |

OTHER PUBLICATIONS

S. Meiboom, D. Gill: Modified Spin–Echo Method for Measuring Nuclear Relaxation Times: Jun. 6, 1958.

A.M. Parfitt: Stereologic Basis of Bone Histomorphometry Theory of Quantitative Microscopy and Reconstruction of the Third Dimension: Chapter 5: CRC Press, Inc.

Donald B. Kimmel, Webster S.S. Jee; Measurements of Area, Perimeter, and Distance; Details of Data Collection in Bone Histomorphometry; Chapter 6; CRC Press.

* cited by examiner

Primary Examiner—Diego Gutierrez
Assistant Examiner—Brij B. Shrivastav
(74) Attorney, Agent, or Firm—Gunn, Lee & Hann; Michelle Evans

(57) ABSTRACT

Magnetic resonance technology can be used to non-invasively measure bone porosity, pore size distribution, and other bone properties, including aging, in situ. Spin-lattice ($T_1$) as well as spin-spin ($T_2$) relaxation time data and spectra are used to determine porosity and pore size distribution in human bones, including compact bones.

24 Claims, 6 Drawing Sheets

| SAMPLE NUMBER | AGE (YEARS) | SEX | SAMPLE VOLUME ($V_B$ = cm$^3$) | FLUID VOLUME $V_F$ = cm$^3$ (DETERMINED BY NMR MEASUREMENT) | POROSITY = $V_F/V_B$ (%) |
|---|---|---|---|---|---|
| 1 | 21 | F | 16.0 | 1.30 | 8.1 |
| 3 | 21 | F | 6.8 | 0.533 | 7.8 |
| 4 | 34 | M | 11.6 | 1.034 | 8.9 |
| 5 | 37 | F | 10.0 | 1.251 | 12.5 |
| MEAN ± STANDARD DEVIATION | | | | | 9.3 ± 2.2 |
| 6 | 73 | M | 13.0 | 2.418 | 18.6 |
| 7 | 76 | F | 9.0 | 3.315 | 36.8 |
| 8 | 77 | F | 16.5 | 3.184 | 19.3 |
| 2 | 89 | M | 17.5 | 3.647 | 20.8 |
| MEAN ± STANDARD DEVIATION | | | | | 23.9 ± 8.7 |

Fig. 4

NUCLEAR MAGNETIC RESONANCE TECHNOLOGY FOR NON-INVASIVE CHARACTERIZATION OF BONE POROSITY AND PORE SIZE DISTRIBUTIONS

BACKGROUND OF THE INVENTION

1. Field of the Invention

Applicant's invention relates to magnetic resonance technology as applied to the non-invasive in-situ measurement of bone porosity, pore size distribution, and other bone properties including aging.

2. Background Information

Bone is a porous material in nature. In human bone, there are three major natural cavities or "voids". Among them, Haversian and Volkmann's canals play a role in accommodating longitudinal and transverse vascular vessels to transport cells, nutrients, and proteins needed for metabolism inside the bone. Besides, they provide surfaces for bone resorption and formation of cells (osteoclasts and osteoplasts, respectively) to attach to during bone remodeling processes. The diameter of the canals is on the order of 50 microns, with a length of a few millimeters. Cohen, J. and Harris, W. H., "The Three Dimensional Anatomy of the Haversian System," Journal of Bone & Joint surgery, 40-A: 419, 1958. In addition, bone has many small ellipsoidal cavities called lacunae that contain bone cells called osteocytes. Although the role of osteocytes is still not well understood, it has been known that these cells may greatly contribute to the initiation of the bone remodeling process by sensing changes in stress or strain fields around them. These quasi-spherical voids have a diameter of approximately 5 microns. Johnson, J. C., "The Kinetics of Skeletal Remodeling," Birth Defects Original Article Series, 2: 66, 1966. Furthermore, these osteocytes are interconnected by small capillary channels (termed "canaliculi") emanating from the vascular vessels. These canaliculi are about 0.5 micron in diameter, and are considered to be responsible for delivering nutrients and relaying signals between the cells. Johnson, J. C., "The Kinetics of Skeletal Remodeling," Birth Defects Original Article Series, 2: 66, 1966. It is noteworthy that the vascular canals are one order greater in diameter than lacunae, and lacunae are one order greater in diameter than canaliculi.

Previous studies have shown the overall porosity of bone has a significant effect on the mechanical strength of bone. In a comprehensive review on porosity of bone, Martin described that small changes in porosity would lead to significant changes in the stiffness and strength of bone for both compact and spongy bone. Martin, R. B., "Porosity and Specific Surface of Bone," CRC Critical Reviews in Biomedical Engineering, 10 (3):179, 1984. In a recent study, McCalden reported that the effect of age-related increase of bone porosity on bone properties is manifested in the decreased capacity of bone to absorb post-yield plastic energy. McCalden, R. W., McGeough, J. A., Barker, M. B., Court-Brown, C. M., "Age-related Changes in the Tensile Properties of Cortical Bone: The Relative Importance of Changes in Porosity, Mineralization, and Microstructure," Journal of Bone & Joint Surgery (Am.), 75(8):1193, 1993. Since changes in numbers and sizes of these natural cavities are directly related to the remodeling processes and biomechanical properties of bone, a direct sensing technique to detect such changes in bone has been long wanted. However, particularly for compact bone, none of the current techniques can quantitatively assess the porosity and pore size distribution in a non-invasive manner.

Microgravity induced bone loss has been a major concern for the health of astronauts. Under weightless conditions, the mechanical stimuli to the skeleton is significantly reduced. Based upon the widely accepted theory of bone adaptation to a mechanical environment, such disuse may trigger the bone remodeling processes leading to the reduction of bone mass. However, the underlying mechanisms for such changes still remain unclear. In the past, biochemical assays were widely used to monitor the bone remodeling process in animal models and to study the mechanisms of such bone mass loss. Since all these assays can be performed in an indirect manner, only qualitative results can be obtained. Thus, it would provide great opportunities for researchers to investigate the mechanisms of bone mass loss if a non-invasive and direct monitoring of the bone remodeling process is available. In a sense, by monitoring changes in these natural voids, i.e. Haversian canals, lacunae, and canaliculi, in situ, one may assess the process of bone remodeling.

Magnetic resonance (MR) imaging (MRI) techniques have been used to study soft tissue and the gross skeletal structure. Recently high resolution MR imaging has been used to resolve the larger porosity cavities in trabecular bone structure in vitro at high magnetic field strengths, and in vivo using clinical scanners at fields of 1.5 T. Chung, H., Wehrli, F. W., Williams, J. L., Kugelmass, S. D., "Relationship between NMR Transverse Relaxation, Trabecular Bone Architecture and Strength," Proc. Nat'l. Acad. Sci, USA 90:10250, 1993; Hipp, J. A., Jansujwicz, A., Simmons, C. A., Snyder, B., "Trabecular Bone Morphology Using Micromagnetic Resonance Imaging," J. Bone Mineral Res. 11:286, 1996, Majumdar, S., Gies, A., jergas, M., Grampp, S., Genant, H., "Quantitative Measurement of trabecular Bone Structure Using High Resolution Gradient Echo Imaging of the Distal Radius," Proceeding of the Society of Magnetic Resonance in Medicine, New York, P455, 1993; Jara, H., Wehrli, F. W., Chung, H., Ford, J. C., "High-resolution Variable Flip Angle 3D MR Imaging of Trabecular Microstructure in Vivo," Magnet Reson Med 29:528, 1993. However, this MR imaging technique is not suitable for resolving the smaller pores and voids in compact bone. Compact bone does not generate any detectable MR images of the porosity structure. On the other hand, nuclear magnetic resonance (NMR) spin-spin ($T_2$) or spin-lattice relaxation time ($T_1$) measurements and analyses have been used to determine the porosity and pore size distribution in different porous media. Gallegos, D. P., Munn, K., Smith, D. M., and Stermer, D. L., J. Colloid Interface Sci. 119:127, 1987; Glaves, C. L., and Smith, D. M., J. Membr. Sci. 46:167, 1989; Howard, J. J., and Kenyon, W. E., Mar. pet. Geol. 9:139, 1992; Kenyon, W. E., "Petrophysical Principles of Applications of NMR Logging," The Log Analyst, Mar.–Apr. p21, 1997. For instance, the low field NMR well logging technique uses a similar principle to detect the porosity, pore size distribution and permeability in oil reservoirs where the fluids (oil and water) are in pores in the rock structure-ranging from submicron to submillimeter. This MR technique is based upon the fact that proton relaxation time of fluid (water, oil, etc.) in porous media is shorter than that of pure fluid itself and is a function of the pore size. The enhanced relaxation rate ($1/T_1$ or $1/T_2$) of fluid in a heterogenous system is accounted for by the presence of a relaxation "sink" at the surface of the pores. Owing to the interactions between the fluid molecules and the solid surface of the pore walls, protons near these surfaces relax faster than in the bulk. The fluid in large pores tends to relax slower (longer relaxation time $T_1$ or $T_2$) than fluid in small pores because of the different relative amounts of surface area compared to the volume of bulk fluid. Thus, the measured relaxation profile provides information about pore size distribution, or more precisely, the pore volume to pore surface area ratio distribution while the total amplitude of the pore fluid signal provides a measure of the porosity.

It has been known that water makes up a major portion of the fluid in the bone natural cavities or pores which is similar to water saturated in a rock. Therefore, the amplitude of the $T_2$ relaxation time data can be used to determine the porosity of the bone, and its inversion $T_2$ relaxation distribution can be transformed to the pore size distribution if the surface relaxivity constant is known. NMR $T_2$ relaxation rate ($1/T_2$) is known to depend on a surface-to-volume ratio with the proportionality of the surface relaxivity constant. Since bone has chemical, molecular, and cellular components inside and is more complex than water saturated rock, we may define the bone relaxation time distribution as corresponding to the effective pore size distribution. On the other hand, the chemical, molecular and cellular components are at least similar in all types of bone, therefore, the differences in properties of bone must be in some way related to differences in microstructures which organize or control these elements. Martin, R. B., and David, B. B., "Structure, Function, and Adaptation of Compact Bone," Raven Press, New York, 1989. Thus the effective pore size distribution can provide important microstructure information in bone and be used to study the remodeling processes and biomechanical properties of bone. Meanwhile, from now on, we are going to omit the "effective" in effective pore size for convenience.

SUMMARY OF THE INVENTION

It is an object of the present invention to provide a novel means to use nuclear magnetic resonance to characterize human bone including compact bone.

Still another object of the present invention is to provide a novel means to use nuclear magnetic resonance to characterize the porosity and porosity changes in human bone including compact bone.

Yet another object of the present invention is to provide a novel means to use nuclear magnetic resonance to characterize the pore size distributions and the changes thereof in human bone including compact bone.

It is another object of the present invention to provide a novel means to use nuclear magnetic resonance to characterize age-related human bone including compact bone.

Still another object of the present invention is to provide a novel means to use nuclear magnetic resonance to measure porosity and pore size distributions in human bone in situ.

Another object of the present invention is to provide a novel means to use nuclear magnetic resonance to measure porosity and pore size distributions in human bone, and changes thereof, in situ.

Yet another object of the present invention is to provide a novel means to use nuclear magnetic resonance to non-invasively monitor the condition or deterioration of human bone, including compact bone, as a person ages, and changes in the bone as a person exercises, intakes different food and medicinal formulations, and as a person gains or losses weight, becomes more or less mobile, or is exposed to different gravitational fields.

It is yet another object of the present invention to provide a novel means to use nuclear magnetic resonance that utilizes $T_2$ relaxation data and relaxation spectra, including inversion relaxation spectra, to determine pore size distribution and porosity in human bones including compact bones.

In satisfaction of these and related objectives, Applicant's present invention provides for a means to utilize magnetic resonance technology to non-invasively measure bone porosity, pore size distribution, and other bone properties, including aging, in situ. The significance of this invention is to provide a useful technique for diagnosis for space medicine as well as other clinical applications including living subjects.

BRIEF DESCRIPTION OF THE DRAWINGS

FIG. 4 is a table of estimated porosity of all bone samples used in the preliminary study.

DETAILED DESCRIPTION OF THE PREFERRED EMBODIMENT

Figure 1:
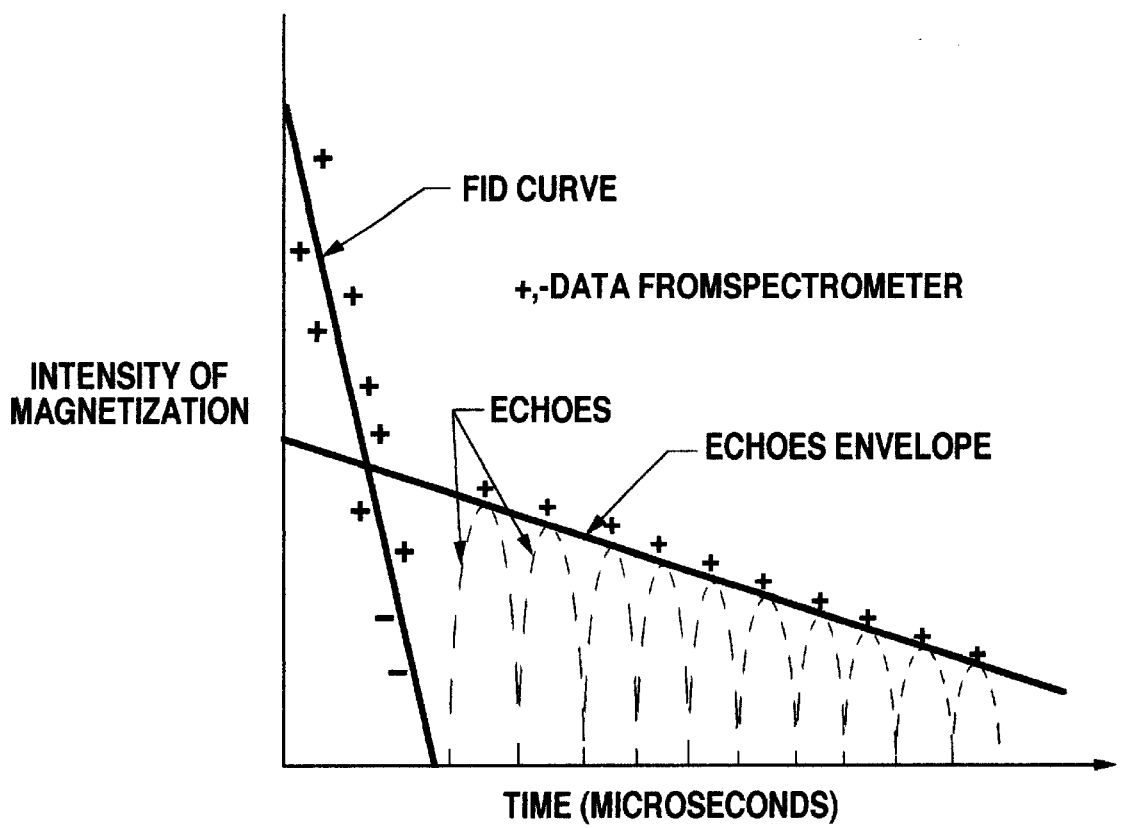
FIG. 1 is a graph of intensity of the proton NMR magnetization signal obtained from a sample of material using the CPMG method versus time in microseconds.

The preferred embodiment of the invention uses a pulsed mode nuclear magnetic resonance (NMR) instrument to detect hydrogen ($^1$H)(proton) signals from the material to be examined. Such an NMR instrument, as is well known, subjects the sample material to a magnetic field, $B_0$, and also to electromagnetic pulses of a selected radio frequency (RF) $v_0$. The amplitude, width, and sequence of the RF pulses may be selected to allow the NMR data of interest to be most optimally obtained from the sample. The frequency, $v_0$, of the RF pulses is selected to correspond to the resonance of protons in the magnetic field, $B_0$. In the preferred embodiment, this B is usually selected to make the NMR frequency in range to 2 to 3 MHz though it may be at higher or lower frequencies. A frequency of 2.3 MHz has been used in our studies. The NMR instrument detects the hydrogen (proton) NMR signal from the sample and uses this data to determine the multiple $T_1$ and/or $T_2$ relaxation times and the total NMR signal amplitude, and the amplitudes of each $T_1$ and/or $T_2$ component in the NMR signal. Generally, either a free induction decay (FID) or a Carr, Purcell, Mieboom, Gill (CPMG) sequence of pulses, both of which are well known to those skilled in the art, is used to obtain the NMR data of interest. The NMR output data is processed to extract the inverse $T_2$ parameters and present this information as an inverse $T_2$ spectra of amplitude versus time. The NMR total amplitude data is also used with a calibration constant, as is described later, to determine the bone porosity. The inversion $T_2$ spectra is converted to a pore size distribution by use of a calibration factor, the relaxivity constant, as is described later in more detail. An NMR instrument for bone study in situ may also include means for minimizing the effect of NMR signals from muscle and other tissue, either inside or outside the bone, on the bone measurements described herein. Such means include techniques for controlling the spatial characteristics of the $B_0$ field and/or the RF field as well as background signal cancellation methods, $T_1$ or $T_2$ range selectivity and other methods.

For the preferred embodiment of the present invention a computational model is used for estimating the relaxivity constant. This model is initially verified experimentally using cumulative $T_2$ distributions and pore capillary pressure curves. Combined with the obtained relaxivity and the measured $T_2$ relaxation distribution, the effective pore size distribution in bone is estimated.

Initial NMR measurements were performed on human bone samples of different age groups (young adults and elderly) and gender groups. Preliminary data have shown that the low field (proton 2.3 MHz) NMR spin-spin relaxation ($T_2$) measurement and the inversion $T_2$ spectrum technique are potentially suitable to detect changes in porosity and pore size distribution, and particularly the changes of age-related porosity and pore size distribution in compact bone. In a pilot study, the $T_2$ inversion relaxation spectra obtained from a 21 year old human compact bone sample indicated a significantly different pattern compared with that of an 89 year old compact bone sample. In addition, in subsequent tests consistent results were obtained from the young age (21 to 37 year old) and old age (73 to 77 year old) groups. These results coincide with the clinical observations on the age-related increase in bone porosity. Major dependent and independent variables affecting the results of the measurements are determined statistically, in terms of the composition of the fluid and bone constituents.

1. NMR Technique Approach a. NMR background

To make an NMR measurement the sample to be examined must be located in a magnetic field $B_0$, and, for transient NMR, the sample must be exposed to bursts (or pulses) of a radio frequency (RF) field, B. Selected nuclei in the sample will absorb energy from the RF field $B_1$ and produce a detectable response when its frequency $\gamma_0$ is related to the static magnetic field $B_0$ by the Larmor equation, Abragam, A., Principles of Nuclear Magnetism, Oxford University Press, Amen House, London, 1961.

$$\nu_0 = \gamma B_0 / 2\pi \tag{1}$$

where $\gamma$ is the gyromagnetic ratio of the particular absorbing nucleus. Following the RF pulse (or pulses) the resonating nuclei precess in the field at an angular frequency, $\omega_0$, and will induce small transient signal voltages in an adjacent sensor coil. These NMR signals are of a frequency, $\nu_0$, and are the magnetization decay signals. This method is generally called time domain NMR, and the peak amplitude of the magnetization, and the transient NMR signals, are proportional to the concentration of selected atomic species (e.g. hydrogen) in the measured volume of the material.

When nuclei absorb energy, thermal equilibrium is disturbed and the absorbed energy is exchanged exponentially with the surroundings. These exchanges are characterized by two primary time constants: the spin-lattice ($T_1$) and the spin-spin or transverse ($T_2$) relaxation times. The first, $T_1$, is related to the time required for nuclei in the material being measured to become polarized in a magnetic field. $T_1$ also sets the minimum time that material must be exposed to a magnetic field prior to an NMR measurement. $T_2$ determines how rapidly the NMR signal decays in a perfect magnetic field. Both $T_1$ and $T_2$ may have multiple values in a multiphase material and these parameters can be used in analysis of the properties of the material.

In general, low field NMR measures three useful parameters: the equilibrium nuclear magnetization, $M_{S+1}$, (including liquid-like and solid-like phases) which is proportional to the total protons in bone material, and two relaxation time constants, longitudinal relaxation time, $T_1$, and spin-spin relaxation time, $T_2$ which can be correlated with bone properties such as porosity, pore size, and permeability.

b. NMR measurements for bone porosity and solid component determination

As mentioned, the total intensity of equilibrium nuclear magnetization, $M_{S+1}$, or the peak amplitude of the NMR signal present in the bone sample is mainly due to the hydrogen nuclei (protons) of water-like fluids present inside the pores (physical water), the protons in the water that has undergone hydration with the bone (chemical water), and the protons in the mineral. The total amplitude of $T_2$ relaxation envelopes, measured by the Carr-Purcell-Meiboom-Gill (CPMG) NMR spin echo train represents the liquid phase inside the pores. Carr, H. Y., and Purcell, E. M., "Effects of Diffusion on Free Procession in Nuclear Magnetic Resonance Experiments," Phy. Rev. 904, No. 3:630, 1954; Meiboom, S., and Gill, D., "Modified Spin-Echo Method for Measuring Nuclear Relaxation Times," Rev. Sci. Inst. 29, 1958.

FIG. 1 is a schematic of the display generated by NMR signals showing the intensity of magnetization (amplitude) versus time in microseconds. In FIG. 1, the intercept of the NMR free induction decay (FID) curve with the vertical axis represents the total equilibrium nuclear magnetization ($M_{S+1}$) which includes all the proton nuclei in the liquid-like phases (mainly fluid inside the pores) plus the solid-like phases (hydrogen constituents of the solid bone). The intercept of the echo envelope where the vertical axis represents the magnetization, $M_1$, is due to the protons in liquid-like phases inside the pores. The amplitude difference between the two points is the magnetization due to the hydrated protons plus protons in the molecular structure of the solid-like portion, $M_S$, in the bone ($V_1$).

After obtaining the volume of water, $V_1$, in a bone sample by use of NMR calibrated for water and obtaining the volume of the bone sample $V_B$, the porosity of the bone can be calculated as $V_1/V_B$. The protons of the solid component inside the bone can be estimated as $M_S = M_{S+1} - M_1$, where $M_1$ is the number of protons in the water volume $V_1$ and $M_{S+1}$ is the total protons in the sample. $M_S$ can be related to the solid volume by use of a calibration factor based on the average protons per unit volume of the solid.

c. The relationship between NMR data and pore sizes

In fluid saturated porous media, $T_2$ values are shorter for pore fluids than for the same fluids in bulk form. The pore fluids interact with the pore surface (walls) to promote NMR relaxation. In the fast diffusion limit, the $T_2$ (and $T_1$) relaxation rate $1/T_2$ is proportional to the surface-to-volume (S/V) ratio of the pore, Brownstein, K. R. and Tarr, C. E., "Importance of Classical Diffusion in NMR Studies of Water in Biological Cells," Phys. Rev. A. v19:2446, 1979:

$$1/T_2 = \rho (S/V)_{pore} \tag{2}$$

where $\rho$ is the surface relaxivity, which is a measure of the pore surface's ability to enhance the relaxation rate. It falls within a reasonably narrow band for a bone material roughly from ten to hundreds of microns per second.

In the CPMG NMR sequence ($90°-t-180°-\text{echo-delay}$) for spin-spin relaxation measurement of a fluid contained in a single pore size, the echo following the 180° rotation of the magnetization vector is given by $$M(t) = M_{0\ exp}(-t/T_2) \tag{3}$$

where $M_0$ is the magnetization of the nuclei at equilibrium and M(t) is the observed magnetization at a variable delay time t between the 90° and 180° measurement pulses. For a porous bone, the observed magnetization will depend upon the $T_2$ (i.e. pore size) of all pores.

As shown in equation (2) NMR relaxation time is proportional to pore size. It is known that rocks and bones have broad distributions of pore sizes. This implies that NMR transverse relaxation ($T_2$) data can be expressed as a sum of exponential functions:

$$M(t)=\Sigma_i M_{i\,exp}(-t/T_{2i}) \quad (4)$$

where $M_i$ is proportional to the number of spins which relax with a time constant $T_{2i}$. M(t) is the NMR magnetization decay of fluid saturated bones. Equation (4) can be inverted into $T_2$ relaxation time distribution. Thus, instead of estimating a single relaxation time from a magnetization decay, it is necessary to estimate a spectrum or distribution of relaxation times $M(T_{2i})$. In water-saturated bones, the bulk water relaxation rate ($1/T_{2B}$) is often negligible, because the bulk water relaxation time, $T_2B$, is about 2–3 seconds. However, for pore water $T_2$ ranges from submilliseconds to several hundred milliseconds, and the distribution of $T_2$ arises from the distribution of surface-to-volume ratio of the pores, as shown in Equation (2). Since $T_2$ depends linearly upon pore size, the $T_2$ distribution corresponds to pore-size distribution with the largest pores having the longest relaxation times.

d. Computational analysis for inversion $T_2$ relaxation spectrum

Computing the $T_2$ spectrum from M(t) in Equation (4) is not straightforward. The spin-spin relaxation time, $T_2$, is a function of the fluid, proton frequency, temperature, pore surface chemistry, and pore size. For a porous rock, the observed magnetization will depend upon the $T_2$ (i.e. pore size) of all pores. The variation of magnetization with time may be obtained by summing over all $T_2$'s:

$$M(t)=M_0\int_{min}^{max}\exp(-t/T_2)f(T_2)dT_2 \quad (5)$$

where $T_{2min}$ and $T_{2max}$ represent the smallest and largest $T_2$'s expected for the particular bone. $T_{2max}$ is usually taken to be the value for the bulk fluid used to saturate the pores. The function, $f(T_2)$, is the desired $T_2$ distribution which is related to the pore volume distribution. The extraction of $f(T_2)$ from the observed magnetization, M(t), requires the solution of Equation (5). To avoid the oscillations which result from the direct inversion of Equation (5) when the problem is under constrained, a smoothing term is added to the right side of a nonnegative least squares routine method, Gallegos, D. P. and Smith, D. M., "A NMR Technique for the Analysis of Pore Structure: Determination of Continuous Pore Size Distributions," J. Colloid Interface Sci. Vol. 122, No. 1, 1988:

$$E=\int[M_{exp}(t)-M_{theo}(t)]^2 dt+\delta\int f(T_2)^2 dT_2 \quad (6)$$

The value of the smoothing parameter, δ, is adjusted and optimized such that the deviations between clinical observations and NMR pore size distributions are minimized.

e. Surface relativity and pore size distribution

Using current techniques, the pore size distribution can be estimated from digital analysis of thin-section images, mercury injection (capillary pressure), and air-brine capillary pressure curves. The capillary pressure curve is commonly used to measure the size distribution of the pore throat. This capillary pressure curve is obtained by drainage, i.e. displacement of a wetting fluid by a non-wetting fluid. The relationship between the capillary pressure and the pore throat size is described by:

$$P_c=2\sigma\cos\theta/r_t \quad (7)$$

Where $r_t$ is the pore throat radius, σ is non-wetting fluid/wetting fluid surface tension, and θ is the contact angle between wetting fluid and non-wetting fluid on the solid surface.

The most often used fluids in drainage are mercury/air and air/brine. The use of the air/brine combination can achieve the irreducible water saturation $S_{wir}$, whereas mercury/air does not ensure this state. For a rock saturated with a single fluid, the $T_2$ relaxation distribution can be transformed to the pore size distribution of the rock if surface relaxivity ρ is known as in Equation (2). In Equation (2), NMR $T_2$ relaxation depends on surface-to-volume ratio with proportionality constant ρ.

To estimate the NMR relaxivity, if we assume the pores are isolated pores with tube-like shapes and act independently then Equation (2) becomes $$T_2=(\tfrac{1}{2}\rho)r_b \quad (8)$$

Given the above assumptions, $T_2$ is now proportional to the radius of the pore body. The combination of Equations (7) and (8) leads to the relationship between $T_2$ and $P_c$ as follows:

$$1/P_c=CT_2 \quad (9)$$

where $$C=(\rho/\sigma\cos\theta)r_t/r_b \quad (10)$$

By making the assumption that the pore throat to pore body ratio $r_t/r_b$ does not vary from pore to pore, then the universal constant C may be determined by minimizing the merit function $X^2$ as $$X^2=\Sigma(\log_{10}T_{2,i}-\log_{10}1/P_{C,i})^2 \quad (11)$$

Given C, σ, and θ, then $$\rho'=\rho r_t/r_b=C(\sigma\cos\theta) \quad (12)$$

where ρ' is the effective $T_2$ surface relaxivity which includes the contributions from ρ and $r_t/r_b$. From now on, the superscript in effective relaxivity will be omitted for convenience. Using this method the calculated relaxivity of the different bone samples can be obtained. Using this relaxivity the pore size distributions can be estimated from the NMR data. From a data base from many types and ages of bone samples, the appropriate relaxivity function for using NMR for assessing the pore sizes of new samples is available.

2. Experimental NMR Studies a. Age related pattern difference

Figure 2A:
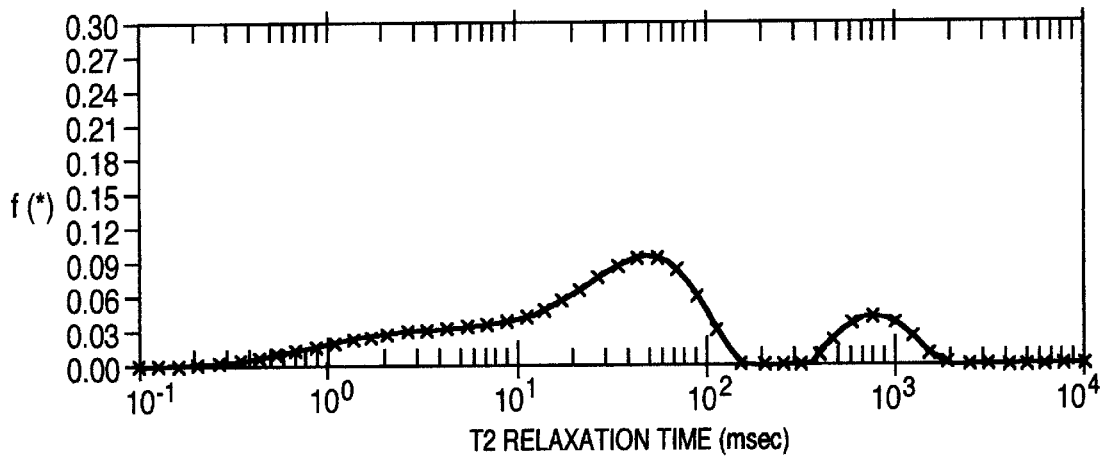
FIG. 2 is the proton NMR inversion $T_2$ relaxation time spectra from human bone samples of (a) 21 year old (#1) and (b) 89 year old (#2).
Figure 2B:
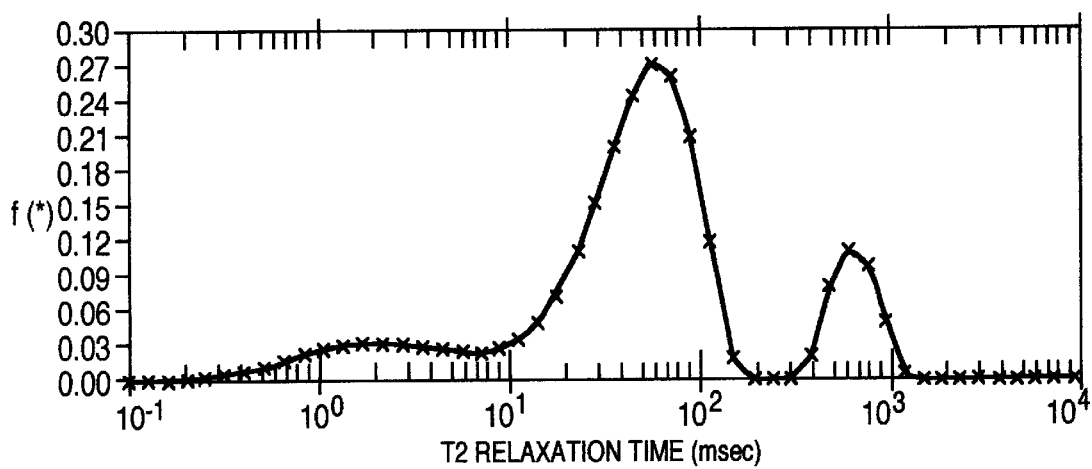
Figure 3A:
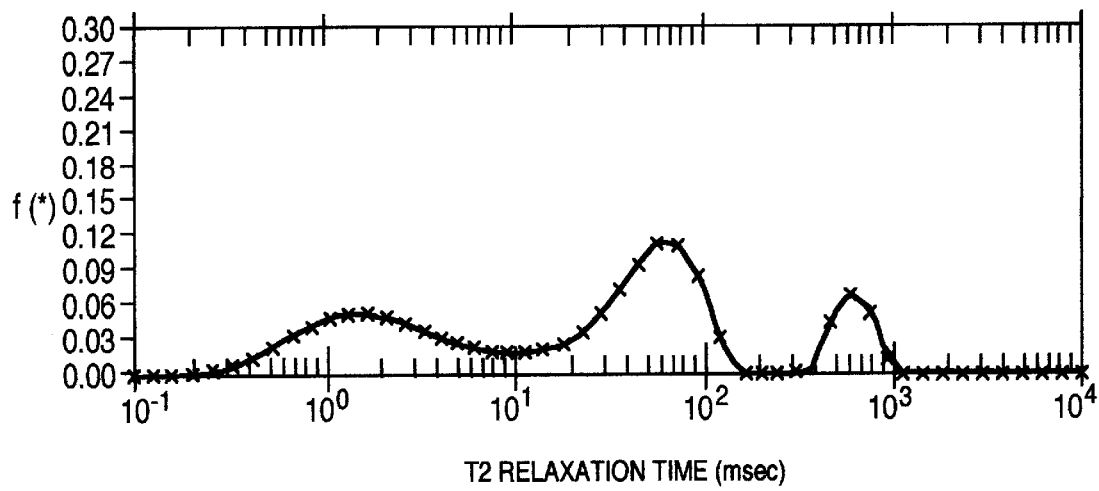
FIG. 3 is the proton NMR inversion $T_2$ relaxation time spectra from human bone samples of (a) 21 year old (#3), (b) 34 year old (#4), (c) 37 year old (#5), (d) 73 year old (#6), (e) 76 year old (#7), and (f) 77 year old (#8).
Figure 3B:
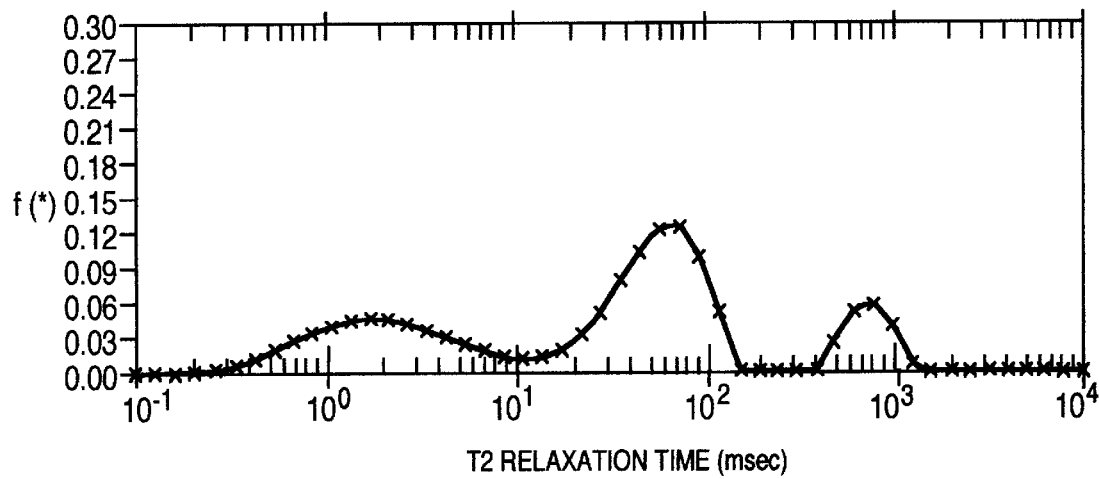
Figure 3C:
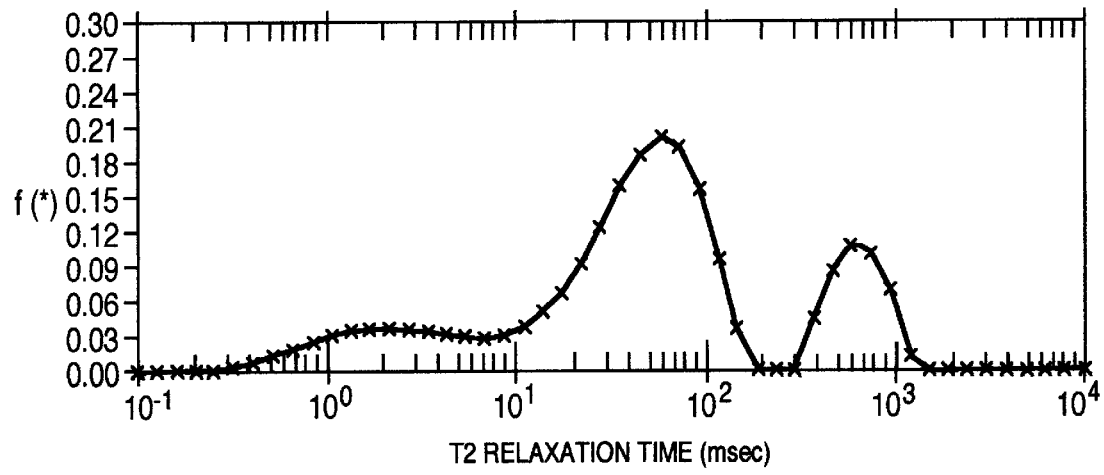
Figure 3D:
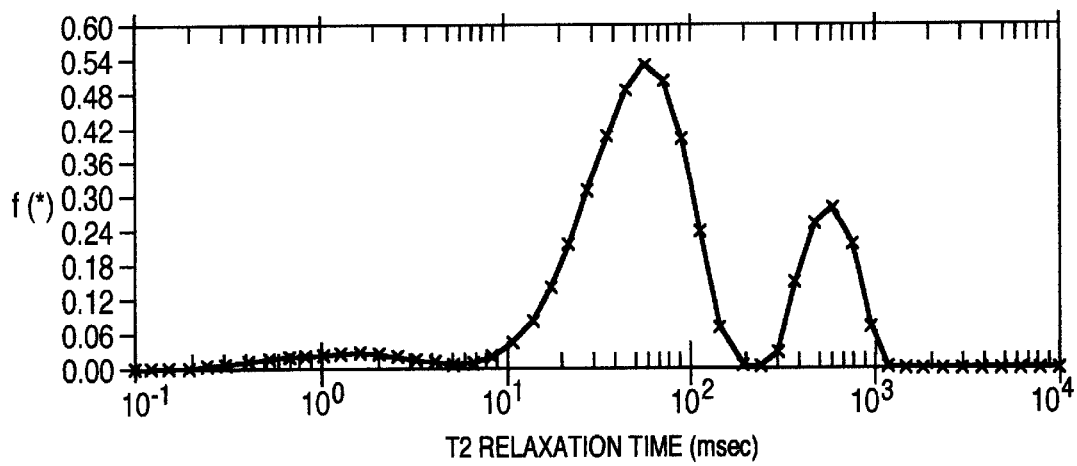
Figure 3E:
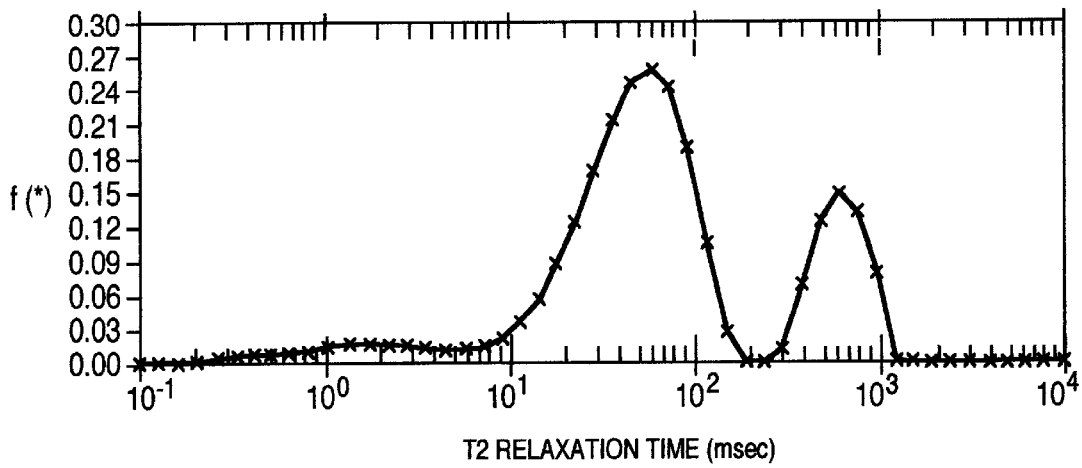
Figure 3F:
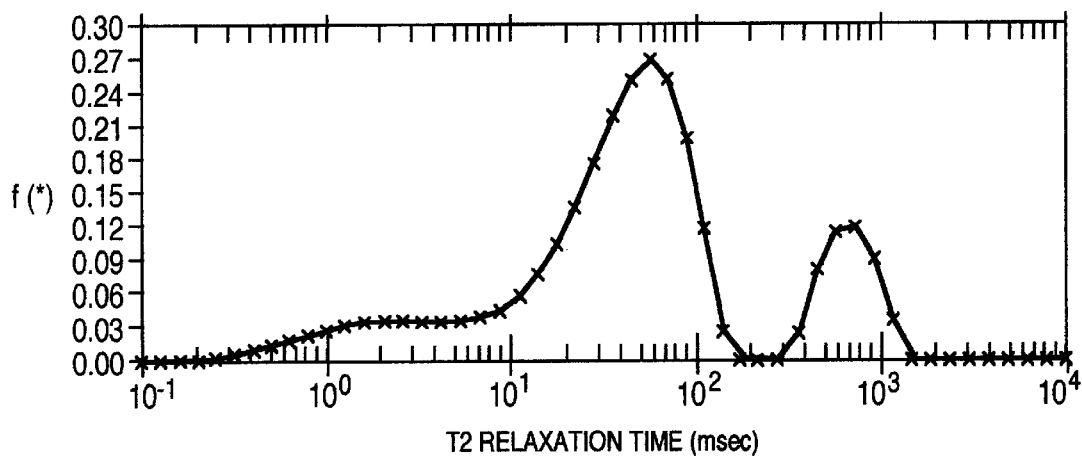

The first test was performed on human compact bone using low field pulsed NMR on samples of a 21 year old and an 89 year old. The CPMG spin-spin relaxation ($T_2$) measurement was performed on each and their inversion $T_2$ relaxation spectra were obtained and are displayed in FIG. 2. The pattern of the two spectra shows significant differences, particularly in the middle peaks, i.e. the amplitude ratio of left to middle peaks in the two spectra are clearly very different. According to the theory of the relaxation time and the pore size, the longer relaxation times represent the larger pore sizes. By comparing the spectral signal intensities, it can be interpreted that the proportion of the larger pores is increased from the young to the old samples.

A second test was performed on two age groups of compact bone samples, i.e. a young and an old age group. The young age group is from age 21 to age 37 including two female samples and one male sample. The old group is from age 73 to age 77 including one female sample and two male samples. The inversion $T_2$ relaxation distribution spectra are shown in FIG. 3. This second test further confirmed the general results of the first test and also indicated differences within the same age groups. These preliminary data show that NMR spin-spin ($T_2$) measurement and its inversion ($T_2$) spectrum technique are potentially suitable to detect and measure changes in the porosity and pore size distribution in compact bone. Both test results show that extensive information can be provided by these spectra.

b. Porosity determination

By using the NMR CPMG spin echo measurements and the interception analysis method, the estimated porosity of all the bone samples used in the preliminary study was determined and listed in FIG. 4. From FIG. 4 the porosity differences between the young group (21 to 37) and the old group (73 to 89) are evident. It is also found that there are differences in the young and old age group themselves. During the measurements looking at the appearance of the sample it was found that the sample number 7 was much thinner than all other samples; however, the NMR signal intensity was still high and resulted in a higher porosity indication from the bone. It indicates that sample number 7 has an extreme bone loss compared to the normal bone. In addition from FIG. 3, the relative intensity ratio of peak 2 (middle) to peak 1 (left) is consistent with the porosity change order. It may suggest that the relative peak intensity change, particularly in peak 2, is more relative to the bone mass change or the porosity change.

Figure 5:
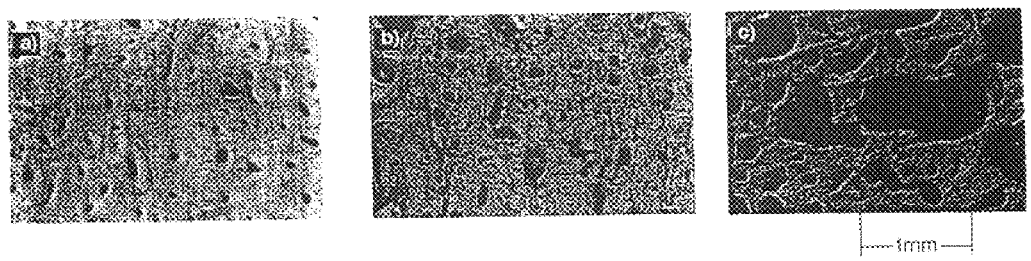
FIG. 5 is a microscopic view of the cross section for bone samples of (a) 21 year old (#1), (b) 73 year old (#6), and (c) 76 year old (#7).

For the same samples used in the NMR tests, FIGS. 5a, 5b, and 5c show the microscope pictures for the 21 year old (#1), 73 year old (#6), and 76 year old (#7)samples, respectively. The pictures show clear differences among these samples, particularly for sample #7. All these pictures are very consistent with the NMR results of FIG. 4 and the $T_2$ inversion relaxation spectra in FIGS. 2a, 3d, and 3e.

c. Effective pore size distribution

The muscle proton NMR signal will not directly interfere with the measurement of the bone signal at the short $T_2$ end of the spectra, i.e., the small pore size region of the bone signal. However, means to enhance the amplitude of the bone signal compared to the muscle and tissue signal must be used to obtain useful bone data in vivo. This can be achieved by spatial selectivity such as is used in MRI by shaping the magnetic field or by filtering to effectively reduce the amplitude of the tissue background signal relative to the short $T_2$ bone signal.

The NMR signals from muscle and fat have typical $T_2$ of 10 milliseconds or more and would not affect, or interfere with, the bone signal in the short relaxation range (about 1 millisecond). Since it was shown in FIG. 2 and FIG. 3 that the short range relaxation time plays an important role in bone performance, $T_2$ change in this region is most sensitive to the age-related bone change. Thus, this invention provides the basis for a non-invasive NMR methodology and instrument to characterize bone in vivo.

Although the invention has been described with reference to specific embodiments, this description is not meant to be construed in a limited sense. Various modifications of the disclosed embodiments, as well as alternative embodiments of the inventions will become apparent to persons skilled in the art upon the reference to the description of the invention. It is therefore, contemplated that the appended claims will cover such modifications that fall within the scope of the invention.

We claim:

1. A method for using nuclear magnetic resonance to characterize bone porosity comprising the steps of:

immersing a bone sample in an external magnetic field;

providing an oscillating radio frequency electromagnetic field for exciting protons within said bone sample;

providing a receiver means for receiving signals in the form of data from the excited protons;

plotting said signals into a spectrum;

measuring the distribution of the protons in said bone sample from said spectrum; and processing said data to characterize said bone porosity wherein said processing step includes determining the $T_1$ and/or $T_2$ relaxation times from said data.

2. The method for using nuclear magnetic resonance to characterize bone porosity of claim 1 wherein said processing step determining the total NMR signal amplitude.

3. The method for using nuclear magnetic resonance to characterize bone porosity of claim 1 wherein said processing step includes determining the amplitudes of each $T_1$ and/or $T_2$ component in said signal.

4. The method for using nuclear magnetic resonance to characterize bone porosity of claim 1 wherein said oscillating radio frequency electromagnetic field is administered using a free induction decay or Carr, Purcell, Mieboom, Gill sequence of pulses.

5. The method for using nuclear magnetic resonance to characterize bone porosity of claim 1 wherein said processing step includes further processing said data to extract the inverse $T_2$ to present said data as an inverse $T_2$ spectra of amplitude versus time.

6. The method for using nuclear magnetic resonance to characterize bone porosity of claim 1 wherein said processing step includes converting said inverse $T_2$ spectra to a pore size distribution by use of a relaxivity constant.

7. The method for using nuclear magnetic resonance to characterize bone porosity of claim 1 wherein said processing step includes minimizing the effect of muscle and other tissue by spatially varying said external magnetic field and said oscillating radio frequency electromagnetic field.

8. The method of using nuclear magnetic resonance to characterize bone porosity of claim 1 wherein said processing step includes minimizing the effect of NMR signals from muscle and other tissue by use of a selected range of $T_1$ or $T_2$ to which it is responsive.

9. The method for using nuclear magnetic resonance to characterize bone porosity of claim 6 wherein said relaxivity constant is estimated computationally from experimental data or cumulative $T_2$ distributions and pore capillary pressure curves.

10. The method for using nuclear magnetic resonance to characterize bone porosity of claim 1 wherein said processing step includes determining an intercept of the free induction decay curve with the vertical decay, t=0 axis, which represents the total equilibrium nuclear magnetization comprising all proton nuclei in the liquid like phases and the solid like phases of said bone sample, determining an intercept of the CPMG echo envelope with the vertical decay t=0, axis which represents the magnetization due to the protons in the liquid like phases within the pores of said bone sample and determining the amplitude difference between said two intercepts to determine the magnetization due to the protons in the molecular structure of said solid like phase in said bone sample.

11. The method for using nuclear magnetic resonance to characterize bone porosity of claim 10 wherein said proton magnetization is multiplied by a calibration factor representing the number of protons per unit volume in said solid like phase to obtain a measure of the total volume of the bone within the measured region.

12. An apparatus for using nuclear magnetic resonance to characterize bone porosity comprising:
- an external magnetic field into which is immersed a bone sample;
- an oscillating radio frequency electromagnetic field in proximity to said external magnetic field for exciting NMR active nuclei within said bone sample;
- a receiver means associated with said external magnetic field and said oscillating radio frequency electromagnetic field for receiving signals in the form of data from the excited NMR active nuclei;
- a plotter associated with said receiver means for plotting said signals into a spectrum;
- a measurement means associated with said plotter for measuring the distribution of properties of the NMR active nuclei in said bone sample from said spectrum; and a
- processor associated with said measurement device for processing said data to characterize said bone porosity.

13. The apparatus for using nuclear magnetic resonance to characterize bone porosity of claim 12 wherein said NMR active nuclei are protons.

14. The apparatus for using clear magnetic resonance to characterize bone porosity of claim 12 wherein said processor determines the T1 and/or T2 relaxation times.

15. The apparatus for using nuclear magnetic resonance to characterize bone porosity of claim 12 wherein said processor determines the total NMR signal amplitude.

16. The apparatus for using nuclear magnetic resonance to characterize bone porosity of claim 12 wherein said processor determines the amplitudes of each T1 or T2 component in said signal.

17. The apparatus for using nuclear magnetic resonance to characterize bone porosity of claim 12 wherein said oscillating radio frequency electromagnetic field is administered using a free induction decay or Carr, Purcell, Mieboom, Gill sequence of pulses.

18. The apparatus for using nuclear magnetic resonance to characterize bone porosity of claim 12 wherein said processor processes said data to extract the inverse T2 to present said data as an inverse T2 spectra of amplitude versus time.

19. The apparatus for using nuclear magnetic resonance to characterize bone porosity of claim 12 wherein said processor converts said inverse T2 spectra to a pore size distribution by use of a relaxivity constant.

20. The apparatus for using nuclear magnetic resonance to characterize bone porosity of claim 12 wherein said processor minimizes the effect of muscle and other tissue by spacially varying said external magnetic field and said oscillating radio frequency electromagnetic field.

21. The apparatus for using nuclear magnetic resonance to characterize bone porosity of claim 19 wherein said relaxivity constant is estimated computationally from experimental data or cumulative T2 distributions and pore capillary pressure curves.

22. The apparatus for using nuclear magnetic resonance to characterize bone porosity of claim 12 wherein said processor determines an intercept of the free induction decay curve with the vertical decay t=0 axis which represents the total equilibrium nuclear magnetization comprising all proton nuclei in the liquid like phases and the solid like phases of said bone sample, determines an intercept of the CPMG echo envelope with the vertical decay t=0 axis which represents the magnetization due to the protons in the liquid like phases within the pores of said bone sample and determines the amplitude difference between said two intercepts to determine the magnetization due to the protons in the molecular structure of said solid like phase in said bone sample.

23. The apparatus for using nuclear magnetic resonance to characterize bone porosity of claim 22 wherein said proton magnetization is multiplied by a calibration factor representing the number of protons per unit volume in said solid like phase to obtain a measure of the total volume of the bone within the measured region.

24. The apparatus for using nuclear magnetic resonance to characterize bone porosity of claim 12 wherein said processor minimizes the effect of NMR signals from muscle and other tissue by use of a means to select a range of $T_1$ or $T_2$ to which it is responsive.

* * * * *